US007352210B2

(12) United States Patent
Luo

(10) Patent No.: US 7,352,210 B2
(45) Date of Patent: *Apr. 1, 2008

(54) DEVICE AND METHOD FOR VOLTAGE REGULATOR WITH STABLE AND FAST RESPONSE AND LOW STANDBY CURRENT

(75) Inventor: Wenzhe Luo, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 11/567,135

(22) Filed: Dec. 5, 2006

(65) Prior Publication Data

US 2007/0176672 A1 Aug. 2, 2007

Related U.S. Application Data

(63) Continuation of application No. 11/060,922, filed on Feb. 17, 2005, now Pat. No. 7,190,189.

(30) Foreign Application Priority Data

Sep. 16, 2004 (CN) ........................ 2004 1 0066517

(51) Int. Cl.
*H03K 17/16* (2006.01)

(52) U.S. Cl. ........................................ 326/82; 323/311

(58) Field of Classification Search .................. 326/31, 326/33, 82, 83; 323/311-313
See application file for complete search history.

*Primary Examiner*—Don Le

(74) *Attorney, Agent, or Firm*—Townsend and Townsend and Crew, LLP

(57) ABSTRACT

An apparatus and method for regulating voltage levels. The apparatus includes a first transistor and a second transistor. The first transistor and the second transistor are each coupled to a first current source and a second current source. Additionally, the apparatus includes a third transistor coupled to the second transistor and configured to receive a first voltage from the second transistor, and a fourth transistor configured to receive the first voltage from the second transistor and generate an output voltage. Moreover, the apparatus includes an adaptive system coupled to the fourth transistor. Also, the apparatus includes a delay system coupled to the third transistor and configured to receive a sensing current from the third transistor and generate a delayed current associated with a predetermined time delay. Additionally, the apparatus includes a current generation system.

18 Claims, 2 Drawing Sheets

DEVICE AND METHOD FOR VOLTAGE REGULATOR WITH STABLE AND FAST RESPONSE AND LOW STANDBY CURRENT

CROSS-REFERENCES TO RELATED APPLICATIONS

This application is a continuation of U.S. Application No. 11/060,922, filed Feb. 17, 2005 now U.S. Pat. No. 7,190,189 which claims priority to Chinese Patent Application No. 200410066517.7, filed Sep. 16, 2004. Both applications are commonly assigned and incorporated by reference herein for all purposes.

The following three commonly-owned co-pending applications, including the parent application to which this application claims priority, were filed concurrently and the other two are hereby incorporated by reference in their entirety for all purposes:

1. U.S. Pat. application Ser. No. 11/061,062, in the name of Wenzhe Luo, titled, "Device and Method for Voltage Regulator with Low Standby Current,"

2. U.S. Pat. application Ser. No. 11/060,922, in the name of Wenzhe Luo, titled, "Device and Method for Voltage Regulator with Stable and Fast Response and Low Standby Current," and 3. U.S. Pat. application Ser. No. 11/061,197, in the name of Wenzhe Luo and Paul Ouyang, titled, "Device and Method for Low-Power Fast-Response Voltage Regulator with Improved Power Supply Range,"

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

The present invention is directed to integrated circuits. More particularly, the invention provides a device and method for stable voltage regulator with fast response. Merely by way of example, the invention has been applied to a battery powered system. But it would be recognized that the invention has a much broader range of applicability.

The voltage regulator is widely used and integrated onto an integrated circuit chip. The integrated circuit chip may contain numerous transistors with shrinking size. The decrease in transistor size usually requires lowering the turn-on voltage of the transistors. Hence the power supply voltage for the integrated circuit chip decreases with shrinking transistor size. The integrated circuit chip usually serves as a system component. The system also contains other subsystems whose working voltages may be higher than the turn-on voltage of the transistors. Hence the power supply voltage for the system may be higher than that for the integrated circuit chip. For example, the system power supply equals 5 volts, and the chip power supply equals 3.3 volts. In another example, the system power supply equals 3.3 volts, and the chip power supply equals 1.8 volts.

To provide the chip power supply, the system power supply is usually converted by a voltage regulator. For example, the voltage regulator receives a 5-volt signal and generates a 3.3-volt signal. In another example, the voltage regulator receives a 3.3-volt signal and generates a 1.8-volt signal. FIG. 1 is a simplified diagram for voltage regulator. A voltage regulator 100 includes a reference voltage generator 110, an operational amplifier 120, and a voltage divider 130. The voltage generator 110 generates a reference voltage $V_{ref}$ 112. The $V_{ref}$ 112 is received by the operational amplifier 120. The operational amplifier 120 also receives an system power supply $V_{system}$ 124 and generates an output voltage $V_{out}$ 122. The $V_{out}$ 122 is divided by the voltage 130 and the feedback voltage $V_{feedback}$ 132 is received by the operational amplifier. The $V_{out}$ 122 is used as the chip power supply. For example, the system power supply is 5 volts, and the desired chip power supply is 3.3 volts. If the $V_{ref}$ 112 equals 1.25 volts, the voltage divider 130 sets $V_{feedback}$ 132 to be equal to $(1.25/3.3)V_{out}$. In another example, the $V_{ref}$ 112 equals the desired chip power supply. Then the $V_{out}$ 122 is used directly as the $V_{feedback}$ 132 with the voltage divider 130 removed.

The voltage regulator usually provides the chip power supply when the system is in the active mode or the standby mode. The current of the voltage regulator in the standby mode consumes important energy. For example, the operating current of the voltage regulator ranges from 30 to 200 μA. The energy consumption in the standby mode limits the operation time of battery-powered devices. Further, some battery-powered devices require low standby power consumption and hence cannot rely on the power regulator. Consequently, these battery-powered devices usually cannot take advantage of the shrinking transistor size.

From the above, it is seen that an improved technique for voltage regulator is desired.

BRIEF SUMMARY OF THE INVENTION

The present invention is directed to integrated circuits. More particularly, the invention provides a device and method for stable voltage regulator with fast response. Merely by way of example, the invention has been applied to a battery powered system. But it would be recognized that the invention has a much broader range of applicability.

In a specific embodiment, the invention provides an apparatus for regulating voltage levels. The apparatus includes a first transistor and a second transistor. The first transistor and the second transistor are each coupled to a first current source and a second current source. Additionally, the apparatus includes a third transistor coupled to the second transistor and configured to receive a first voltage from the second transistor, and a fourth transistor configured to receive the first voltage from the second transistor and generate an output voltage. Moreover, the apparatus includes an adaptive system coupled to the fourth transistor. The adaptive system is associated with an effective resistance in response to a second control signal. Also, the apparatus includes a delay system coupled to the third transistor and configured to receive a sensing current from the third transistor and generate a delayed current associated with a predetermined time delay. Additionally, the apparatus includes a current generation system coupled to the delay system, the first transistor, the second transistor and the fourth transistor. The first transistor is configured to receive a reference voltage and the second transistor is configured to receive a feedback voltage. The feedback voltage is substantially proportional to the output voltage. The first current source is configured to receive a first control signal and generate a first current in response to the first control signal. The first control signal is associated with either an active mode or a standby mode. The first voltage is associated with a difference between the reference voltage and the feedback voltage. The second control signal is associated with either the active mode or the standby mode. The current generation system is configured to receive the delayed current from the delay system, output a second current to the first transistor and the second transistor, and output a third current to the fourth transistor. The second current and the third current are each substantially proportional to the delayed current.

According to another embodiment of the present invention, an apparatus for regulating voltage includes a first transistor and a second transistor. The first transistor and the second transistor are each coupled to a first current source and a second current source. Additionally, the apparatus includes a third transistor configured to receive a first voltage from the second transistor and generate an output voltage. The first transistor is configured to receive a reference voltage and the second transistor is configured to receive a feedback voltage. The feedback voltage is substantially proportional to the output voltage. The first current source is configured to receive a first control signal, generate the first current if the first control signal is associated with the active mode, and be free from generating the first current if the first control signal is associated with the standby mode. The second current source is configured to generate a second current, and the first current is larger than the second current. The first voltage is associated with a difference between the reference voltage and the feedback voltage.

According to yet another embodiment of the present invention, an apparatus for regulating voltage levels includes a first transistor and a second transistor coupled to the first transistor and a third transistor configured to receive a first voltage from the second transistor and generate an output voltage. Additionally, the apparatus includes an adaptive system coupled to the third transistor. The adaptive system is associated with an effective resistance in response to a first control signal. The first transistor is configured to receives a reference voltage and the second transistor is configured to receive a feedback voltage. The feedback voltage is substantially proportional to the output voltage. The first voltage is associated with a difference between the reference voltage and the feedback voltage. The first control signal is associated with either the active mode or the standby mode. The effective resistance is equal to a first resistance value in response to the second control signal being associated with the active mode, and the effective resistance is equal to a second resistance value in response to the second control signal being associated with the standby mode. The first resistance value is smaller than the second resistance value.

According to yet another embodiment of the present invention, an apparatus for regulating voltage levels includes a first transistor and a second transistor coupled to the second transistor, and a third transistor coupled to the second transistor and configured to receive a first voltage from the second transistor. Additionally, the apparatus includes a fourth transistor configured to receive the first voltage from the second transistor and generate an output voltage and an output current associated with the output voltage. Moreover, the apparatus includes a delay system coupled to the third transistor and configured to receive a sensing current from the third transistor and generate a delayed current. The delayed current is associated with a predetermined time delay and substantially proportional to the output current. Also, the apparatus includes a current generation system coupled to the delay system, the first transistor, the second transistor and the fourth transistor. The first transistor is configured to receive a reference voltage, and the second transistor is configured to receive a feedback voltage. The feedback voltage is substantially proportional to the output voltage. The first voltage is associated with a difference between the reference voltage and the feedback voltage. The current generation system is configured to receive the delayed current from the delay system, output a first current to the first transistor and the second transistor, and output a second current to the fourth transistor. The first current and the second current are each substantially proportional to the delayed current.

Many benefits are achieved by way of the present invention over conventional techniques. Certain embodiments of the present invention provide a large biasing current in the active mode and a small biasing current in the standby mode for the first stage of the operational amplifier. The large biasing current shortens the response time of the amplifier feedback loop in the active mode. The small biasing current lowers the power consumption of the voltage regulator and improves loop stability in the standby mode. Some embodiments of the present invention provides a compensation system. The compensation system has an RC constant in the active mode lower than that in the standby mode. The low RC constant in the active mode substantially cancels the zero resulting from the low impedance of the output transistor at high output current. The high RC constant in the standby mode substantially cancels the zero resulting from the high impedance of the output transistor at low output current. The loop stability of the operational amplifier are improved in both the standby mode and the active mode. Certain embodiments of the present invention provide a delay to the sensing current proportional to the output current. The sensing current is mirrored to provide biasing currents to the output transistor and the differential pair of the first stage of the operational amplifier. The delay system and the current mirror can suppress the overshoot when the output current suddenly drops. For example, the output current drops from the milli-ampere level in the active mode to the micro-ampere level in the standby mode. After this sudden drop, the delayed biasing current facilitates the feedback loop of the operational amplifier to quickly reach a new equilibrium. Some embodiments of the present invention provide a low load current and a low standby current consumed by the voltage regulator in the standby mode. For example, the load current is 1 μA, and the standby current around 1 μA. These embodiments also provide high stability and fast response to the load current change. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits. More particularly, the invention provides a device and method for stable voltage regulator with fast response. Merely by way of example, the invention has been applied to a battery powered system. But it would be recognized that the invention has a much broader range of applicability.

Figure 1:
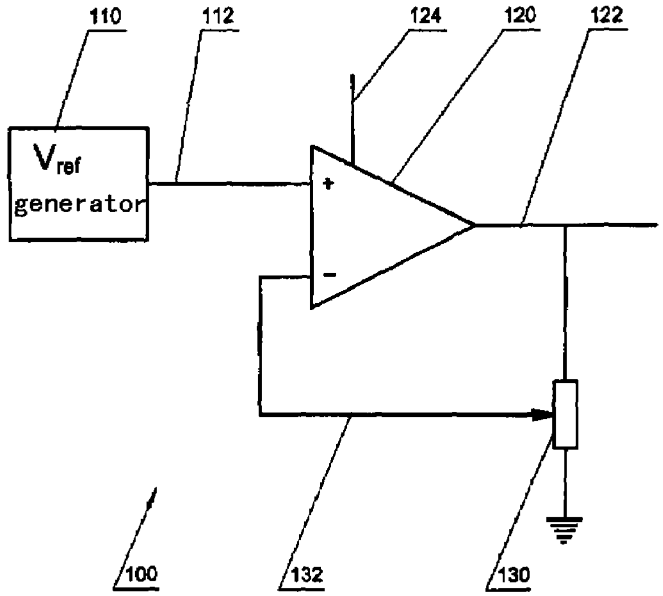
FIG. 1 is a simplified diagram for voltage regulator.
Figure 2:
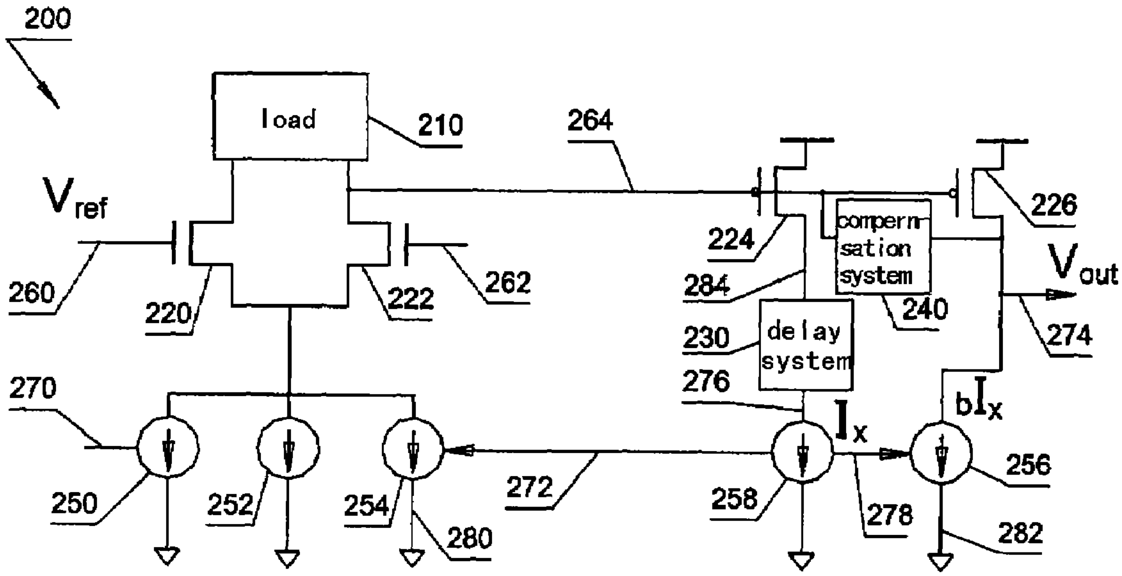
FIG. 2 is a simplified operational amplifier for voltage regulator according to an embodiment of the present invention.

FIG. 2 is a simplified operational amplifier for voltage regulator according to an embodiment of the present invention. This diagram is merely an example, which should not unduly limit the scope of the claims herein. The device 200 includes the following components:

1. Load 210;
2. Transistors 220, 222, 224 and 226;
3. Delay system 230;
4. Compensation system 240;
5. Current supplies 250 and 252;
6. Current mirror including current mirror components 258, 256 and 254.

The above electronic devices provide components for an operational amplifier of a voltage regulator according to an embodiment of the present invention. For example, the operation amplifier 200 serves as the operational amplifier 120 for the voltage regulator 100. Other alternatives can also be provided where certain devices are added, one or more devices are removed, or one or more devices are arranged with different connections sequence without departing from the scope of the claims herein. For example, the current supplies 250 and 252 are removed and the transistors 220 and 222 are directly coupled to the ground level. In another example, the compensation system is replaced by a constant resistor and a constant capacitor in series. In yet another example, the transistor 224, the delay system 230 and the current mirror including the current mirror components 254, 256 and 258 are removed. Future details of the present invention can be found throughout the present specification and more particularly below.

The load 210 couples the transistors 220 and 222 with a voltage source. For example, the voltage source is the same as the power supply to the system of which the voltage regulator is a component. The voltage source may range from 1.8 V to 5 V. In another example, the load includes a current mirror. The load 210, the transistors 220 and 222, and the current supplies 250, 252 and 254 form a first stage of the operational amplifier 200. The transistors 220 and 222 serve as the differential pair. For example, the transistors 220 and 222 are NMOS transistors.

The transistors 220 and 222 receive the reference voltage $V_{ref}$ 260 and the feedback voltage $V_{feedback}$ 262. For example, the $V_{ref}$ 260 ranges from 1 V to 3.3 V. If the $V_{feedback}$ 262 is different from the $V_{ref}$260, the first stage of the operational amplifier generates a change in the intermediate voltage $V_{intermediate}$ 264. The current supply 250 is controlled by a mode signal 270. If the mode signal 270 indicates an active mode, the current supply 250 is turned on. If the mode signal 270 indicates a standby mode, the current supply 250 is turned off. For example, the current supply 250 ranges from 2 μA to 20 μA, and the current supply 252 ranges from 100 nA to 1 μA. In another example, the current supply 250 is much larger than the current supply 252 in magnitude. The current mirror component 254 provides a current 280 in response to a control signal 272. For example, the current 280 ranges from 1 μA to 30 μA.

The $V_{intermediate}$ 264 is received by the transistor 224. The transistors 224 and 226, the delay system 230, the compensation system 240, and the current mirror component 256 form a second stage of the operational amplifier 200. The transistors 224 and 226 are coupled to a voltage source. For example, the voltage source is the same as the power supply to the system of which the voltage regulator is a component. The voltage source may range from 1.8 V to 5 V. The transistor 226 serves as the output transistor which generates an output voltage $V_{out}$ 274 and supplies the load current. The transistor 224 may provide a faction of the load current to bias the amplifier. For example, the transistors 224 and 226 are PMOS transistors.

As discussed above, the current mirror components 258, 256 and 254 form the current mirror. The current mirror component 258 servers as a controlling device, and the current mirror components 254 and 256 serve as controlled devices. The currents provided by the current mirror components 254 and 256 are proportional to the current through the current mirror component 258. The proportionality constants may depend on the ratio of the device dimensions. For example, the current mirror components 258,264 and 256 are NMOS devices with common gate voltage and sources connected to the ground. The proportionality constants may depend on the ratios of W/L related to the NMOS devices.

Figure 3:
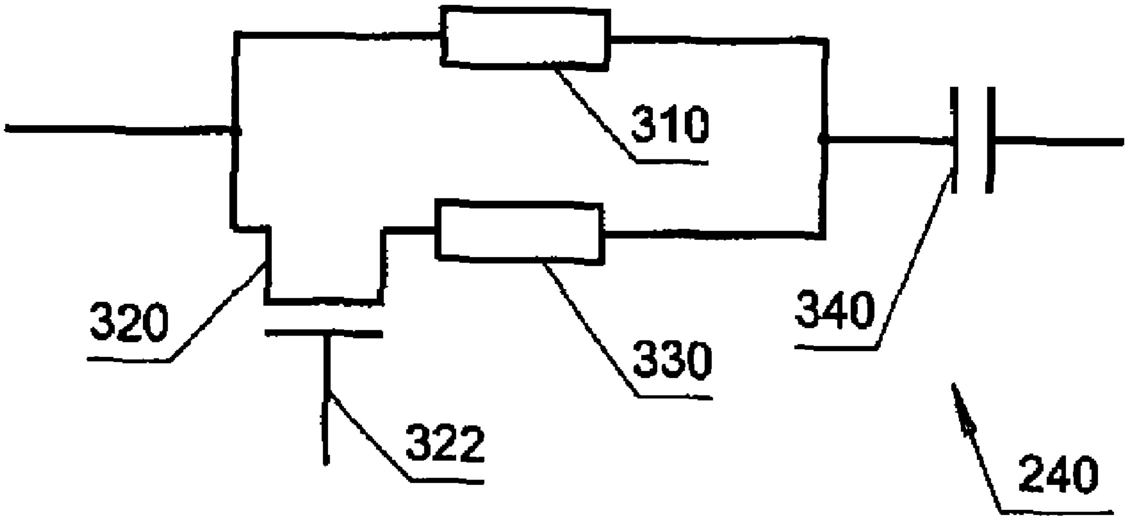
FIG. 3 is a simplified compensation system for the operational amplifier according to an embodiment of the present invention.

FIG. 3 is the simplified compensation system 240 for the operational amplifier 200 according to an embodiment of the present invention. This diagram is merely an example, which should not unduly limit the scope of the claims herein. The compensation system 300 includes the following components:

1. Transistor 320;
2. Resistors 310 and 330;
3. Capacitor 340.

The above electronic devices provide components for the compensation system 240 according to an embodiment of the present invention. Other alternatives can also be provided where certain devices are added, one or more devices are removed, or one or more devices are arranged with different connections sequence without departing from the scope of the claims herein. Future details of the present invention can be found throughout the present specification and more particularly below.

The transistor 320 receives a mode signal 322. If the mode signal 322 indicates an active mode, the transistor 320 is turned on. If the mode signal 322 indicates a standby mode, the transistor 320 is turned off. For example, the mode signal 322 is the same as the mode signal 270. When the transistor is turned on, the resistors 310 and 330 are in parallel. When the transistor 320 is turned off, the resistor 330 is cut off from any current flow. The resistance of the compensation system 240 in the active mode is smaller than in the standby mode. For example, the resistor 310 has a resistance larger than that of the resistor 330. The resistor 310 may range from 50 KOhm to 1 MOhm, and the resistor 330 may range from 500 Ohm to 5 KOhm. Additionally, the capacitor 340 may range from 5 pF to 50 pF. In the active mode, the RC constant of the compensation system 240 is lower than that in the standby mode. The compensation system is adaptive to the mode signal 322.

As shown in FIG. 2, the operational amplifier for voltage regulator also includes the delay system 230 and the current mirror including the current mirror components 254, 256 and 258. The delay system 230 is coupled to the transistor 224 which serves as a sensing transistor. The sensing transistor generates a sensing current 284 which is proportional to the output current corresponding to the $V_{out}$ 274. The delay system 230 receives the sensing current 284 and generates a delayed current $I_x$ 276. The delay may range from 5 ns to 500 ns. The $I_x$ 276 is received by the current mirror component 258, which in response generates control signals 272 and 278. For example, the control signals 272 and 278 are the same voltage signal proportional to the $I_x$ 276. The control signal 272 is received by the current mirror component 254 which generates the current 280 equal to $aI_x$. Similarly, the control signal 278 is received by the current mirror component 256 which generates the current 282 equal to $bI_x$. The proportionality constants a and b may be the same or different. For example, a ranges from 0.25 to 10, and b ranges from 0.25 to 10. The delay system 230 and the current mirror including the current components 254, 256 and 258 serve as a current generation system in response to the delayed current $I_x$ 276.

The present invention has various advantages. Certain embodiments of the present invention provide a large biasing current in the active mode and a small biasing current in the standby mode for the first stage of the operational amplifier. The-large biasing current shortens the response time of the amplifier feedback loop in the active mode. The small biasing current lowers the power consumption of the voltage regulator and improves loop stability in the standby mode. Some embodiments of the present invention provides a compensation system. The compensation system has an RC constant in the active mode lower than that in the standby mode. The low RC constant in the active mode substantially cancels the zero resulting from the low impedance of the output transistor at high output current. The high RC constant in the standby mode substantially cancels the zero resulting from the high impedance of the output transistor at low output current. The loop stability of the operational amplifier are improved in both the standby mode and the active mode. Certain embodiments of the present invention provide a delay to the sensing current proportional to the output current. The sensing current is mirrored to provide biasing currents to the output transistor and the differential pair of the first stage of the operational amplifier. The delay system and the current mirror can suppress the overshoot when the output current suddenly drops. For example, the output current drops from the milli-ampere level in the active mode to the micro-ampere level in the standby mode. After this sudden drop, the delayed biasing current facilitates the feedback loop of the operational amplifier to quickly reach a new equilibrium. Some embodiments of the present invention provide a low load current and a low standby current consumed by the voltage regulator in the standby mode. For example, the load current is 1 μA, and the standby current around 1 μA. These embodiments also provide high stability and fast response to the load current change.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An apparatus for regulating voltage levels, the apparatus comprising:

a first transistor and a second transistor, the first transistor and the second transistor each coupled to a first current source and a second current source;

a third transistor coupled to the second transistor and configured to receive a first voltage from the second transistor;

a fourth transistor configured to receive the first voltage from the second transistor and generate an output voltage;

a delay system coupled to the third transistor and configured to receive a sensing current from the third transistor and generate a delayed current associated with a predetermined time delay;

a current generation system coupled to the delay system, the first transistor, the second transistor and the fourth transistor;

wherein the current generation system is configured to receive the delayed current from the delay system, output a first current to the first transistor and the second transistor, and output a second current to the fourth transistor;

wherein the first current and the second current are each substantially proportional to the delayed current.

2. The apparatus of claim 1 wherein the first current source is configured to receive a first control signal and generate a third current if the first control signal is associated with an active mode and be free from generating the third current if the first control signal is associated with the standby mode.

3. The apparatus of claim 2 wherein the third current and the second current are different.

4. The apparatus of claim 2 wherein the third current and the second current are the same.

5. The apparatus of claim 1 wherein the second current source is configured to generate a fourth current, the fourth current being smaller than the third current.

6. The apparatus of claim 1 wherein the fourth transistor is configured to generate an output current associated with the output voltage, the output current being substantially proportional to the delayed current.

7. An apparatus for regulating voltage levels, the apparatus comprising:

a first transistor and a second transistor, the first transistor and the second transistor each coupled to a first current source and a second current source;

wherein the first current source is configured to receive a first control signal, generate the first current if the first control signal is associated with an active mode, and be free from generating the first current if the first control signal is associated with a standby mode;

wherein the second current source is configured to generate a second current, the first current being larger than the second current.

8. The apparatus of claim 7 wherein the first transistor and the second transistor is associated with a first biasing current level in the active mode and a second biasing current level in the standby mode, the first biasing current level equal to a sum of the first current and the second current, the second biasing current level equal to the second current.

9. An apparatus for regulating voltage levels, the apparatus comprising:

a first transistor and a second transistor coupled to the first transistor;

a third transistor configured to receive a first voltage from the second transistor;

an adaptive system coupled to the third transistor, the adaptive system associated with an effective resistance in response to a first control signal;

wherein the first control signal is associated with either an active mode or a standby mode;

wherein the effective resistance is equal to a first resistance value in response to a second control signal being associated with the active mode and the effective resistance is equal to a second resistance value in response to the second control signal being associated With the standby mode, the first resistance value being smaller than the second resistance value.

10. The apparatus of claim 9 wherein the adaptive system comprises a first resistor, a second resistor, a capacitor, and a fourth transistor, the second resistor in series with the fourth transistor, the fourth transistor coupled to the first resistor and the second resistor.

11. The apparatus of claim 10 wherein the fourth transistor is turned on if the first control signal is associated with the active mode and is turned off if the first control signal is associated with the standby mode.

12. The apparatus of claim 10 wherein the first resistance value is associated with the first resistor and the second resistor, the first resistor and the second resistor in parallel.

13. The apparatus of claim 10 wherein the second resistance value is associated with the first resistor.

14. The apparatus of claim 10 wherein the adaptive system is associated with an RC constant, the RC constant is associated with a first RC value in the active mode and a second RC value in the standby mode, the first RC value being smaller than the second RC value.

15. An apparatus for regulating voltage levels, the apparatus comprising:

a first transistor and a second transistor coupled to the first transistor;

a third transistor configured to receive a first voltage from the second transistor;

a fourth transistor configured to receive the first voltage from the second transistor and generate an output voltage and an output current associated with the output voltage;

a delay system coupled to the third transistor and configured to receive a sensing current from the third transistor and generate a delayed current, the delayed current associated with a predetermined time delay and substantially proportional to the output current;

a current generation system coupled to the delay system, the first transistor, the second transistor and the fourth transistor;

wherein the current generation system is configured to receive the delayed current from the delay system, output a first current to the first transistor and the second transistor, and output a second current to the fourth transistor;

wherein the first current and the second current are each substantially proportional to the delayed current.

16. The apparatus of claim 15 wherein the current generation system comprises a current mirror system including a first current mirror component, a second current mirror component and a third current mirror component, the first current mirror component coupled to the second current mirror component and the third current mirror component.

17. The apparatus of claim 16 wherein the first current mirror component is configured to receive the delayed current from the delay system and output a first control signal to the second current mirror component and a second control signal to the third current mirror component, the first control signal and the second control signal each associated with the delayed current.

18. The apparatus of claim 17 wherein the second current mirror component is configured to receive the first control signal and output the first current to the first transistor and the second transistor, and the third current mirror component is configured to receive the second control signal and output the second current to the fourth transistor.

* * * * *